(12) United States Patent
Weissenmayer et al.

(10) Patent No.: US 10,587,259 B2
(45) Date of Patent: Mar. 10, 2020

(54) DEVICE AND METHOD FOR GENERATING A DIFFERENTIAL VOLTAGE

(71) Applicant: Robert Bosch GmbH, Stuttgart (DE)

(72) Inventors: Simon Weissenmayer, Flein (DE);
Steffen Walker, Reutlingen (DE);
Jochen Huebl, Schwieberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/128,868

(22) Filed: Sep. 12, 2018

(65) Prior Publication Data

US 2019/0089345 A1 Mar. 21, 2019

(30) Foreign Application Priority Data

Sep. 20, 2017 (DE) .................. 10 2017 216 667

(51) Int. Cl.
*H03K 17/16* (2006.01)
*G05F 1/625* (2006.01)
*H03K 19/0175* (2006.01)

(52) U.S. Cl.
CPC ............ *H03K 17/16* (2013.01); *G05F 1/625* (2013.01); *H03K 19/0175* (2013.01)

(58) Field of Classification Search
CPC .......... H03K 17/0822; H03K 17/6871; H03K 3/012; H03K 17/145; H03K 17/16; H03K 17/18; H03K 17/687; H03K 19/14; H03K 3/037; H03K 5/24; H03K 5/156
USPC .................. 327/108, 109, 110, 111, 112
See application file for complete search history.

(56) References Cited

U.S. PATENT DOCUMENTS

| 6,559,689 | B1 | 5/2003 | Clark | |
|---|---|---|---|---|
| 2002/0196054 | A1* | 12/2002 | Ohkido | H03F 3/72 327/65 |
| 2005/0083106 | A1* | 4/2005 | Hazucha | H02M 3/073 327/337 |
| 2017/0194860 | A1 | 7/2017 | Oak et al. | |

FOREIGN PATENT DOCUMENTS

WO 2016039688 A1 3/2016

* cited by examiner

*Primary Examiner* — John W Poos
(74) *Attorney, Agent, or Firm* — Norton Rose Fulbright US LLP; Gerard Messina

(57) ABSTRACT

A circuit and a method are described for generating differential voltages.

7 Claims, 3 Drawing Sheets

DEVICE AND METHOD FOR GENERATING A DIFFERENTIAL VOLTAGE

FIELD OF THE INVENTION

The present invention relates to a device and a method for generating a differential voltage.

BACKGROUND INFORMATION

To generate a differential voltage, a first terminal is connected to a supply voltage via a first switch and a first current limiting and a second terminal is connected to ground via a second switch and a second current limiting. Since the switches do not switch at exactly the same time and the currents swell to a differently strong extent at the terminals depending on the temperature and aging, common-mode interferences develop which interfere with the differential signal transfer in the further course due to asymmetric conductor guidance.

Common-mode interferences due to asymmetric signal generation should be avoided, so that the signals are less interfered with.

SUMMARY

The present invention provides the advantage that common-mode interferences due to asymmetric signal generation are prevented. Thus, the signals are less interfered with.

It is provided to generate a corresponding differential signal with the aid of a current from an electrically isolated energy source.

In the embodiment according to the present invention, a capacitor $C_1$ may be charged when switches $S_3$ and $S_4$ are closed, switches $S_1$ and $S_2$ being open at the same time. After charging the capacitor, switches $S_3$ and $S_4$ are opened. To generate a differential voltage, switches $S_1$ and $S_2$ are closed. Due to the electrical isolation, it is possible to open and close switches $S_1$ and $S_2$ with a time delay, without an undesirable common-mode signal resulting therefrom. The currents via switches $S_1$ and $S_2$ and thus at corresponding terminals L and H always have exactly the same absolute value.

Preferably, those capacitors should be used which may be implemented in silicon. To generate longer signals, a second parallel circuit according to the present invention is thus provided, it being possible to permanently achieve a desired level.

It is also possible to generate a negative level, as is implemented in a third specific embodiment.

Additional advantages and advantageous embodiments may be derived from the description of the figures and the drawings.

DETAILED DESCRIPTION

Figure 1:
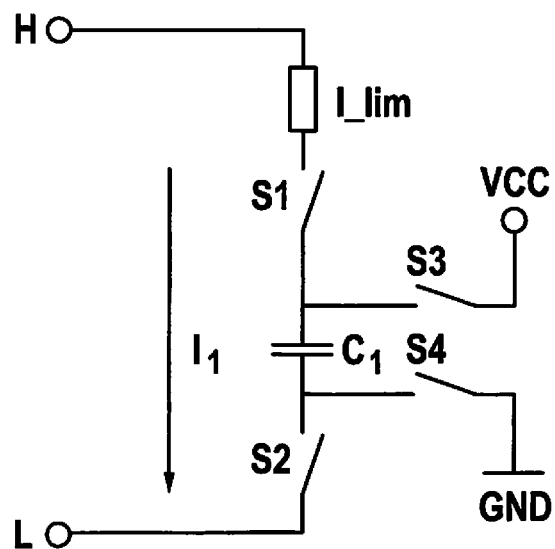
FIG. 1 shows a circuit drawing of one exemplary embodiment of the circuit according to the present invention.

FIG. 1 shows a circuit for generating differential voltages. The differential voltage is measured at terminals H and L. A current limiting $I_{lim}$, a switch $S_1$, a first capacitor $C_1$, and a switch $S_2$ are connected between terminals H and L.

First capacitor $C_1$ is provided to facilitate a current flow $I_1$ from terminal L to terminal H in the charged state. A current cannot flow from L to H until both switches $S_1$ and $S_2$ are closed. The currents via $S_1$ and $S_2$ and thus at terminals L and H have exactly the same absolute value, regardless of temperatures, aging, or the like. If, for example, a differential voltage of 2 volts is to be achieved and the cable impedance is 60 ohm, then the current is limited to 33 mA with the aid of current limiting $I_{lim}$. It is also conceivable, however, that larger or smaller currents flow, so that the desired differential voltage may be achieved faster or have a higher degree of accuracy.

In this process, first capacitor $C_1$ is discharged.

In order to charge first capacitor $C_1$, two further switches $S_3$ and $S_4$ are provided. When switches $S_3$ and $S_4$ are closed, a potential $V_{CC}$ is connected to GND via first capacitor $C_1$ and first capacitor $C_1$ is charged.

Figure 2:
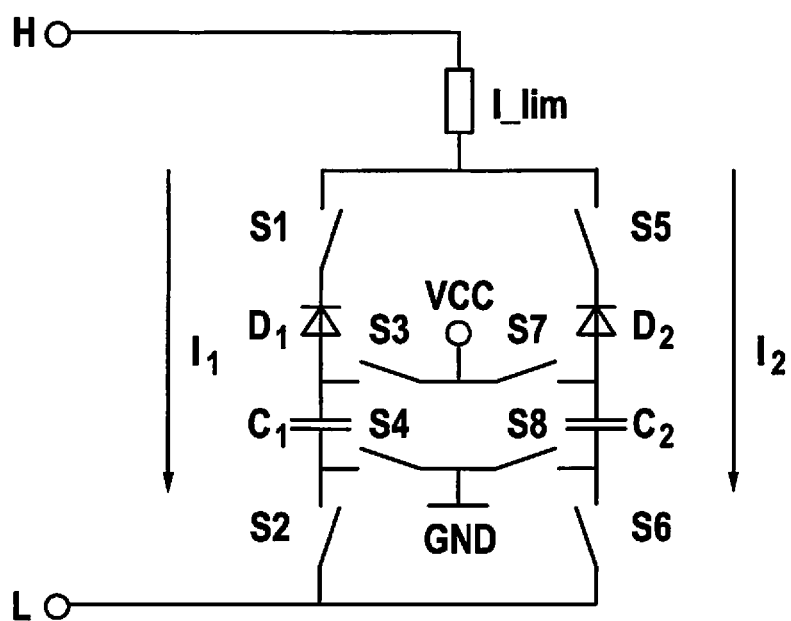
FIG. 2 shows a circuit drawing of a second exemplary embodiment of the circuit according to the present invention.

FIG. 2 shows a circuit for generating differential voltages. The design is similar to the design of the circuit, such as the one shown in FIG. 1, a second capacitor $C_2$ being connected in parallel to first capacitor $C_1$. Second capacitor $C_2$ is connected between the two switches $S_5$ and $S_6$.

If first capacitor $C_1$ is exhausted, although the differential voltage is to be continuously maintained, second capacitor $C_2$ is provided to facilitate the flow of current $I_2$ from L to H. Current $I_2$ flows from L to H, when both switches $S_5$ and $S_6$ are closed. During this time, first capacitor $C_1$ may be recharged, so that its energy is available as soon as second capacitor $C_2$ requires charging.

In order to charge second capacitor $C_2$, two further switches $S_7$ and $S_8$ are provided. When switches $S_7$ and $S_8$ are closed, a potential $V_{CC}$ is connected to GND via second capacitor $C_2$ and second capacitor $C_2$ is charged.

As a result of the mutual support of capacitors $C_1$ and $C_2$, it is possible to permanently achieve a desired voltage level, while the capacitors may have smaller dimensions, since they must be able to store only a fraction of the energy necessary to transfer one or multiple bits.

If the supply is switched from first capacitor $C_1$ to second capacitor $C_2$, switches $S_5$ and $S_6$ are closed in addition to already closed switches $S_1$ and $S_2$ and then switches $S_1$ and $S_2$ are opened. Two diodes $D_1$ and $D_2$ are tasked with allowing switches $S_1$, $S_2$, $S_5$, and $S_6$ to be closed simultaneously, without a high compensating current being able to flow from one of capacitors $C_1$, $C_2$ to the respective other capacitor. As soon as switches $S_1$ and $S_2$ are open, first capacitor $C_1$ may be charged when switches $S_3$ and $S_4$ are closed.

Figure 3:
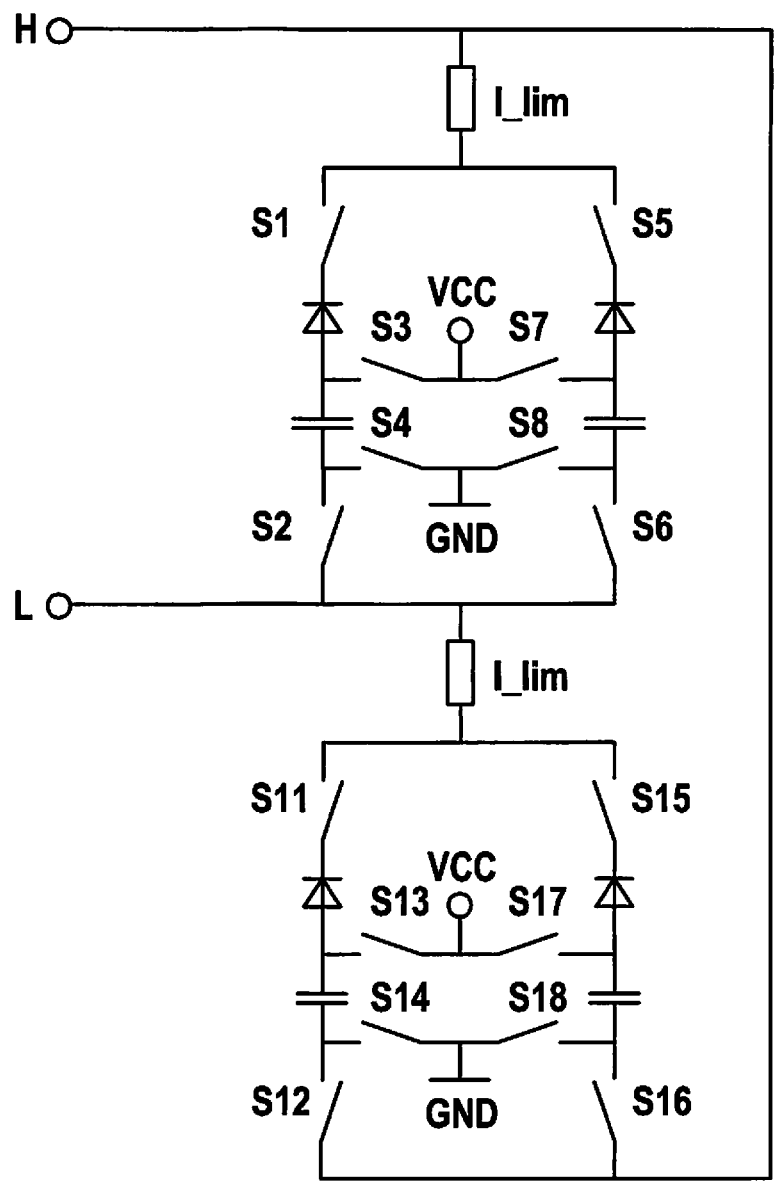
FIG. 3 shows a circuit drawing of a third exemplary embodiment of the circuit according to the present invention.

FIG. 3 shows two circuits, such as the ones shown in FIG. 2, connected in series.

If negative differential voltage changes or negative differential voltages are supposed to be generated, switches $S_{11}$ through $S_{18}$ are actuated in the same manner as switches $S_1$ through $S_8$.

Figure 4:
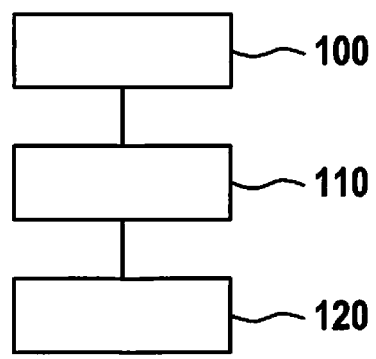
FIG. 4 shows a flow chart of one exemplary embodiment of the method according to the present invention.

FIG. 4 shows a flow chart of the method according to the present invention for generating differential voltages.

At beginning 100, a first capacitor $C_1$ is charged. In a step 110, a switch $S_1$ and a switch $S_2$ are closed. Thereupon, a current $I_1$ flows from a terminal L to a terminal H. As a result, first capacitor $C_1$ is discharged. In [step] 120, switches $S_3$ and $S_4$ are closed. As a result, a potential $V_{CC}$ is connected to GND via first capacitor $C_1$ and first capacitor $C_1$ is charged.

Figure 5:
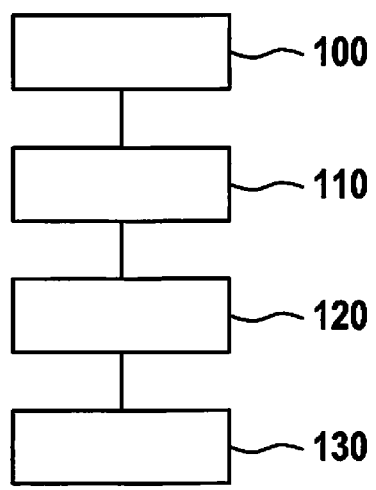
FIG. 5 shows a flow chart of a second exemplary embodiment of the method according to the present invention.

FIG. 5 shows a flow chart of the method according to the present invention for generating differential voltages.

At beginning 100, a first capacitor $C_1$ is charged. In step 110, switch $S_1$ and switch $S_2$ are closed. Thereupon, a current $I_1$ flows from a terminal L to a terminal H. As a result, first capacitor $C_1$ is discharged.

In [step] 120, switches $S_5$ and $S_6$ are closed. The two diodes $D_1$ and $D_2$ are tasked with allowing switches $S_1$, $S_2$, $S_5$, and $S_6$ to be closed simultaneously, without a high compensating current being able to flow from one of capacitors $C_1$, $C_2$ to the respective other capacitor. In [step] 130, switches $S_1$ and $S_2$ are opened. As soon as switches $S_1$ and $S_2$ are open, switches $S_3$ and $S_4$ are closed, so that first capacitor $C_1$ may be charged.

What is claimed is:

1. A circuit for generating a differential voltage, comprising:
    a first single-ended terminal;
    a second single-ended terminal;
    a first capacitor;
    a first switch;
    a second switch, wherein the first capacitor facilitates a first current flow from the second single-ended terminal to the first single-ended terminal in a charged state, when the first switch and the second switch are closed;
    a second capacitor for at least one of:
        adding a second current flow to the first current flow via the first capacitor in the charged state, or
        allowing the second current flow when the first current flow via the first capacitor stops;
    a fifth switch; and
    a sixth switch, wherein the second capacitor facilitates the second current flow from the second single-ended terminal to the first single-ended terminal, when the fifth switch and the sixth switch are closed.

2. A circuit for generating a differential voltage, comprising:
    a first terminal;
    a second terminal;
    a first capacitor;
    a first switch;
    a second switch, wherein the first capacitor facilitates a first current flow from the second terminal to the first terminal in a charged state, when the first switch and the second switch are closed;
    a third switch; and
    a fourth switch, wherein the first capacitor is charged from first and second reference voltages when the third switch and the fourth switch are closed.

3. The circuit as recited in claim 2, further comprising:
    a second capacitor for at least one of:
        adding a second current flow to the first current flow via the first capacitor in the charged state, or
        allowing the second current flow when the first current flow via the first capacitor stops.

4. The circuit as recited in claim 3, further comprising:
    a fifth switch; and
    a sixth switch, wherein the second capacitor facilitates the second current flow from the second terminal to the first terminal, when the fifth switch and the sixth switch are closed.

5. A circuit for generating a differential voltage, comprising:
    a first terminal;
    a second terminal;
    a first capacitor;
    a first switch;
    a second switch, wherein the first capacitor facilitates a first current flow from the second terminal to the first terminal in a charged state, when the first switch and the second switch are closed;
    a second capacitor for at least one of:
        adding a second current flow to the first current flow via the first capacitor in the charged state, or
        allowing the second current flow when the first current flow via the first capacitor stops;
    a fifth switch;
    a sixth switch, wherein the second capacitor facilitates the second current flow from the second terminal to the first terminal, when the fifth switch and the sixth switch are closed;
    a seventh switch; and
    an eighth switch, wherein the second capacitor is charged when the seventh switch and the eighth switch are closed.

6. A method for generating a differential voltage with the aid of a circuit that includes a first terminal, a second terminal, a first capacitor, a first switch, and a second switch, the method comprising:
    providing a first current from the second terminal to the first terminal, when the first capacitor is charged, and the first switch and the second switch are closed;
    charging the first capacitor, when third and fourth switches are closed; and
    providing a second current from the second terminal to the first terminal, when the first current flow via the first capacitor stops and when a second capacitor is charged, and a fifth switch and a sixth switch are closed.

7. The method as recited in claim 6, wherein the second capacitor is charged, when seventh and eighth switches are closed.

* * * * *